(12) United States Patent
Liu et al.

(10) Patent No.: US 10,256,381 B2
(45) Date of Patent: Apr. 9, 2019

(54) ELECTRONIC DEVICE AND METHOD FOR FABRICATING THE SAME

(71) Applicant: AU Optronics Corporation, Hsin-Chu (TW)

(72) Inventors: Yi-Cheng Liu, Hsin-Chu (TW); Ho-Cheng Lee, Hsin-Chu (TW); Wen-Wei Yang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 31 days.

(21) Appl. No.: 15/698,783

(22) Filed: Sep. 8, 2017

(65) Prior Publication Data

US 2018/0114886 A1 Apr. 26, 2018

(30) Foreign Application Priority Data

Oct. 26, 2016 (TW) .............................. 105134623 A

(51) Int. Cl.
*H01L 27/15* (2006.01)
*H01L 33/58* (2010.01)
(Continued)

(52) U.S. Cl.
CPC .............. *H01L 33/58* (2013.01); *F21V 5/007* (2013.01); *F21V 17/04* (2013.01);
(Continued)

(58) Field of Classification Search
CPC ...... H01L 27/15; H01L 27/153; H01L 27/156
See application file for complete search history.

(56) References Cited

U.S. PATENT DOCUMENTS

| 7,972,875 B2 | 7/2011 | Rogers et al. |
| 2010/0123855 A1* | 5/2010 | Shin .................. G02F 1/133617 349/61 |

(Continued)

FOREIGN PATENT DOCUMENTS

| CN | 202394464 U | 8/2012 |
| TW | I533274 | 5/2016 |
| TW | 201635598 A | 10/2016 |

OTHER PUBLICATIONS

Alton Parrish, "Ideas, Inventions and Innovations", 2013, Ideas, Inventions and Innovations Partner with Social Network Booster, "http://www.ineffableisland.com/2012/07/triboelectric-generator-produces.html".

(Continued)

*Primary Examiner* — Jae Lee
(74) *Attorney, Agent, or Firm* — WPAT, PC

(57) ABSTRACT

The present invention provides an electronic device and a method for fabricating the same. The electronic device includes a driving-circuit substrate, light-emitting elements, an optical layer, and an adhesive layer. The light-emitting elements are disposed on the driving-circuit substrate, and the optical layer is disposed on the light-emitting elements. The adhesive layer is disposed between the optical layer and the light-emitting elements. The optical layer includes a first surface and a second surface that are opposite to each other. The first surface of the optical layer has a plurality of first convex lens structures, and at least a part of the first convex lens structures are at least partially overlapped with the light-emitting elements in the vertical projection direction.

10 Claims, 17 Drawing Sheets

(51) Int. Cl.
  *F21V 5/00*    (2018.01)
  *F21V 19/00*   (2006.01)
  *G02B 3/00*    (2006.01)
  *H01L 25/075*   (2006.01)
  *H01L 25/16*    (2006.01)
  *H01L 33/62*    (2010.01)
  *G02B 19/00*   (2006.01)
  *F21V 17/04*    (2006.01)
  *F21Y 105/10*   (2016.01)
  *F21Y 115/10*   (2016.01)

(52) U.S. Cl.
  CPC ........ *F21V 19/0015* (2013.01); *G02B 3/0031* (2013.01); *G02B 3/0056* (2013.01); *G02B 19/0014* (2013.01); *G02B 19/0066* (2013.01); *H01L 25/0753* (2013.01); *H01L 25/167* (2013.01); *H01L 33/62* (2013.01); *F21V 19/0035* (2013.01); *F21Y 2105/10* (2016.08); *F21Y 2115/10* (2016.08); *G02B 3/0068* (2013.01); *G02B 3/0075* (2013.01); *H01L 2933/0058* (2013.01); *H01L 2933/0066* (2013.01)

(56) References Cited

U.S. PATENT DOCUMENTS

2013/0171337 A1   7/2013   Ko et al.
2017/0179192 A1*   6/2017   Zhang .................... H01L 23/29

OTHER PUBLICATIONS

Jung Woo Leem, et al., "Inverted tetrahedron-pyramidal micropatterned polymer films for boosting light output power in flip-chip light-emitting diodes", 2015, vol. 23, Issue 8, Optics Express, Optical Society of America, "https://www.osapublishing.org/oe/fulltext.cfm?uri=oe-23-8-9612&id=315011".

Taiwan patent office "Office Action" dated Jun. 27, 2017, Taiwan.

* cited by examiner

ELECTRONIC DEVICE AND METHOD FOR FABRICATING THE SAME

BACKGROUND

Technical Field

The present invention relates to the technologies of transfer and packaging processes, and more particularly to an electronic device and a method for fabricating the same.

Related Art

A light emitting diode (LED) is a solid-state light-emitting element. An LED has characteristics such as low power consumption, a long service life, a small volume, and high brightness, and therefore can be used to build a pixel unit of an LED display panel. Generally speaking, in a process, for an LED display panel, a transfer technology needs to be used to transfer an LED element to a target substrate where the LED element needs to be mounted. However, in a transfer process, a capture yield of LED elements decreases easily because of uneven downward pressure. Because the capture yield of the LED element decreases, a risk that an LED element falls off from an element transfer layer during movement increases.

SUMMARY

One of the objectives of the present invention is to provide an electronic device and a method for fabricating the same, so as to improve a fabrication yield of the electronic device and improve light emitting efficiency of the electronic device.

In an embodiment, an electronic device comprises: a driving-circuit substrate, a plurality of light-emitting elements, an optical layer, and an adhesive layer. The light-emitting elements are disposed on the driving-circuit substrate, and the optical layer is disposed on the light-emitting elements. The adhesive layer is disposed between the optical layer and the light-emitting elements. The optical layer comprises a first surface and a second surface that are opposite to each other. The first surface of the optical layer has a plurality of first convex lens structures, and at least a part of the first convex lens structures are at least partially overlapped with the light-emitting elements in the vertical projection direction.

In an embodiment, a method for fabricating an electronic device comprises: providing an optical layer having a plurality of first convex lens structures, forming an adhesive layer on the first convex lens structures, picking up light-emitting elements by using the first convex lens structures, and transferring, through the optical layer, the light-emitting elements bonded by the first convex lens structures to a driving-circuit substrate. The optical layer comprises a first surface and a second surface that are opposite to each other, and the first surface has the first convex lens structures. After being picked up, each light-emitting element may be bonded on the first convex lens structures through the adhesive layer.

In conclusion, the electronic device and the method for fabricating the same according to the present invention are applicable to transfer of light-emitting elements. An adhesive layer is directly used to bond the light-emitting elements on an optical layer, and the optical layer does not need to be removed after the light-emitting elements are transferred. Therefore, events such as falling off of the light-emitting elements from the optical layer and misalignment of the light-emitting elements can be avoided, so that a fabrication yield of the electronic device can be improved. Moreover, after transfer, the optical layer is still kept on the light-emitting elements (and does not need to be removed), and is used as a light condensing device of the light-emitting elements, thereby improving light emitting efficiency.

BRIEF DESCRIPTION OF THE DRAWINGS

FIG. 2 and FIG. 3 are respectively schematic diagrams of an upper surface and a lower surface of the optical layer.

FIG. 17 and FIG. 18 are respectively schematic diagrams of an upper surface and a lower surface of the optical layer.

DETAILED DESCRIPTION

Figure 1:
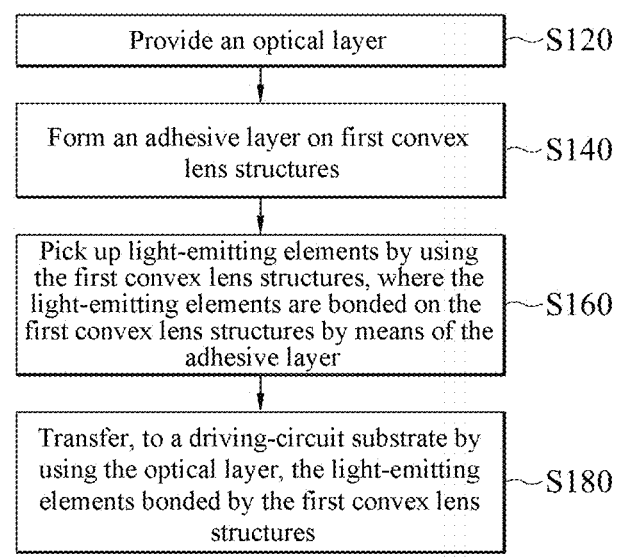
FIG. 1 is a flowchart of a method for fabricating an electronic device according to an embodiment of the present invention.
Figure 2:
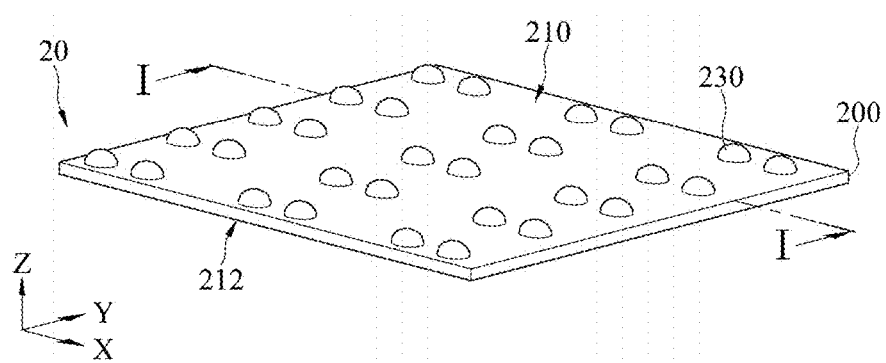
FIG. 2 and FIG. 3 are brief perspective diagrams of an optical layer from different viewing angles according to a first embodiment of the present invention, where
Figure 3:
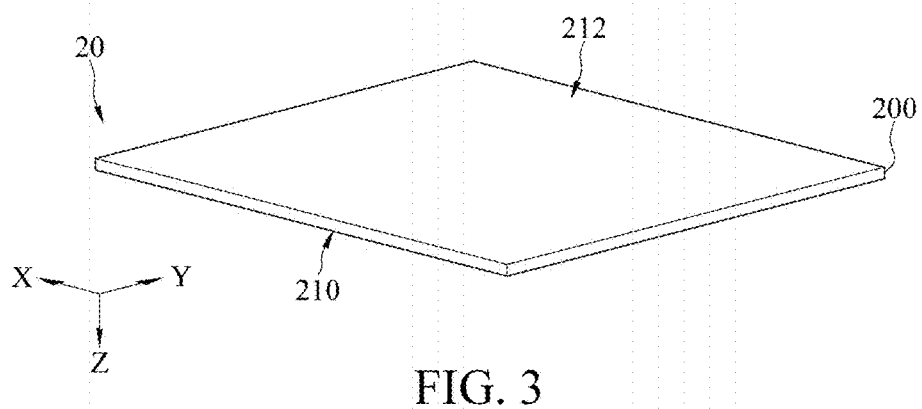
Figure 4:
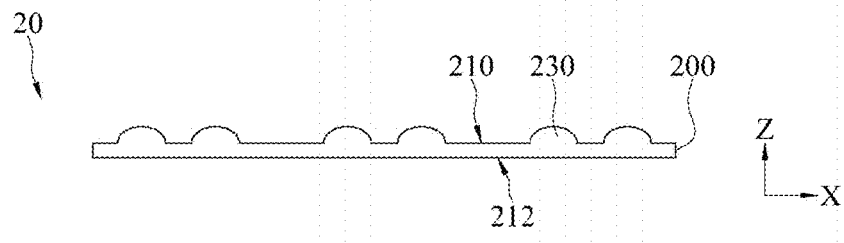
FIG. 4 is a sectional view along a sectional line I-I in FIG. 2.

Refer to FIG. 1 to FIG. 4. First, an optical layer 20 is provided (Step S120). In some embodiments, a refractive index (n) of the optical layer 20 is between 1.4 and 1.6. In some embodiments, an elasticity coefficient (E) of the optical layer 20 is between 1 MPa and 12 MPa, and is preferably between 1 MPa and 5 MPa. In some embodiments, a material of the optical layer 20 is, for example, a transparent and soft material such as polydimethylsiloxane (PDMS) or moldable silicone (MS). For example, when the material of the optical layer 20 is PDMS (Sylgard 184), a refractive index of the material of the optical layer 20 is 1.43 and an elasticity coefficient of the material of the optical layer 20 is 1.84 MPa. When the material of the optical layer 20 is MS-1002 (produced by the company Dow Corning), a refractive index of the material of the optical layer 20 is 1.41 and an elasticity coefficient of the material of the optical layer 20 is 11.2 MPa. When the material of the optical layer 20 is MS-1003 (produced by the company Dow Corning), a refractive index of the material of the optical layer 20 is 1.41 and an elasticity coefficient of the material of the optical layer 20 is 4.5 MPa.

In this embodiment, the optical layer 20 includes an upper surface and a lower surface, that is, a first surface 210 and a second surface 212, that are opposite to each other. A plurality of the first convex lens structures 230 is formed on the first surface 210. Each first convex lens structure 230 is a plano convex lens located on the first surface 210. In other words, a surface of each first convex lens structure 230 is a convex curved surface, and the other surface of each first convex lens structure 230 is a plane which is overlapped and bonded with the first surface 210. In some embodiments, each first convex lens structure 230 and a body 200 of the optical layer 20 are integrally formed, that is, a plane where the first convex lens structure 230 and the body 200 (the first surface 210) bond in fact does not exist. In other words, the first convex lens structure 230 is implemented by a plurality of convex curved surfaces protruding outwardly (the positive Z-axis direction) from the first surface 210.

Figure 5:
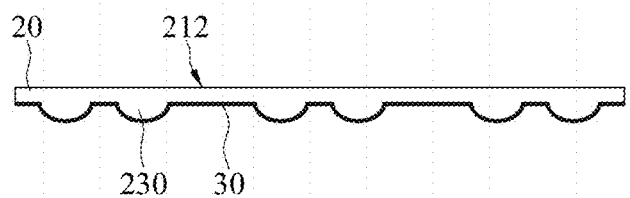
FIG. 5 is a schematic diagram of a combined structure of the optical layer and an adhesive layer according to the first embodiment of the present invention.

Next, an adhesive layer 30 is formed on the first convex lens structures 230 (Step S140). As shown in FIG. 5, in some embodiments, the adhesive layer 30 may be distributed on an entire surface. That is, the adhesive layer 30 is provided on the first surface 210 and the first convex lens structures 230. In other embodiments, the adhesive layer 30 may be distributed on only the first convex lens structures 230 (not shown).

In some embodiments, the adhesive layer 30 may be formed by coating or spraying an adhesion material on the first convex lens structures 230. A refractive index of the adhesive layer 30 may be between 1.4 and 1.7. In some embodiments, for example, a material of the adhesive layer 30 may be an optical adhesive such as an ultraviolet adhesive, glass glue or AB glue. For example, when the material of the adhesive layer 30 is an ultraviolet adhesive HRI-1655 (produced by the company Dow Corning), a refractive index of the material of the adhesive layer 30 is 1.65. When the material of the adhesive layer 30 is an ultraviolet adhesive NOA 1625 (Norland Optical Adhesive 1625) (produced by Norland Products, Inc.), a refractive index of the material of the adhesive layer 30 is 1.625. When the material of the adhesive layer 30 is AB glue (produced by 3M), a refractive index of the material of the adhesive layer 30 is 1.45.

Figure 6:
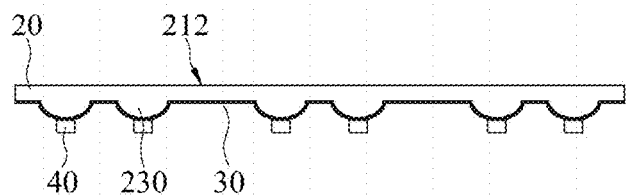
FIG. 6 is a schematic diagram of a combined structure of the optical layer, the adhesive layer, and light-emitting elements according to the first embodiment of the present invention.

Subsequently, a plurality of light-emitting elements 40 is picked up by using the first convex lens structures 230 having the adhesive layer 30 (Step S160), as shown in FIG. 6. The light-emitting elements 40 are bonded on the first convex lens structures 230 through the adhesive layer 30. In particular, in the vertical projection direction (Z-axis) perpendicular to the optical layer 20, each light-emitting element 40 is disposed corresponding to one of the first convex lens structures 230, and is bonded to the corresponding first convex lens structure 230 through the adhesive layer 30. The first convex lens structures 230 are at least partially overlapped with the corresponding light-emitting elements 40 in the vertical projection direction (Z-axis). In an embodiment, each light-emitting element 40 is configured corresponding to one first convex lens structure 230, but the present invention is not limited thereto. In another embodiment, each first convex lens structure 230 may correspond to the plurality of light-emitting elements 40.

In some embodiments, after the adhesive layer 30 is formed on the first convex lens structures 230, the optical layer 20 having the adhesive layer 30 moves above the light-emitting elements 40. In this case, the first convex lens structures 230 face a light emitting surface of the light-emitting elements 40, and is aligned with a corresponding light-emitting element 40. After alignment, the optical layer 20 having the adhesive layer 30 is moved downwardly, to enable the first convex lens structure 230 having the adhesive layer 30 to contact and bond with the light emitting surface of the corresponding light-emitting element 40. In some embodiments, the first convex lens structures 230 may be tightly bonded with the corresponding light-emitting elements 40 by pressing down the optical layer 20 or curing the adhesive layer 30.

Figure 7:
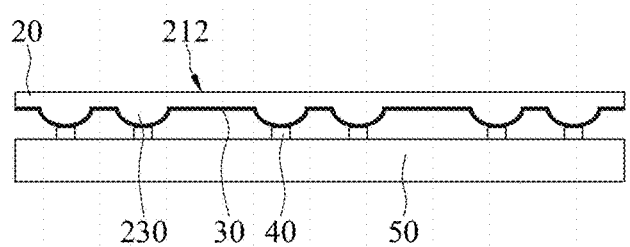
FIG. 7 is a schematic diagram of an electronic device according to the first embodiment of the present invention.
Figure 8:
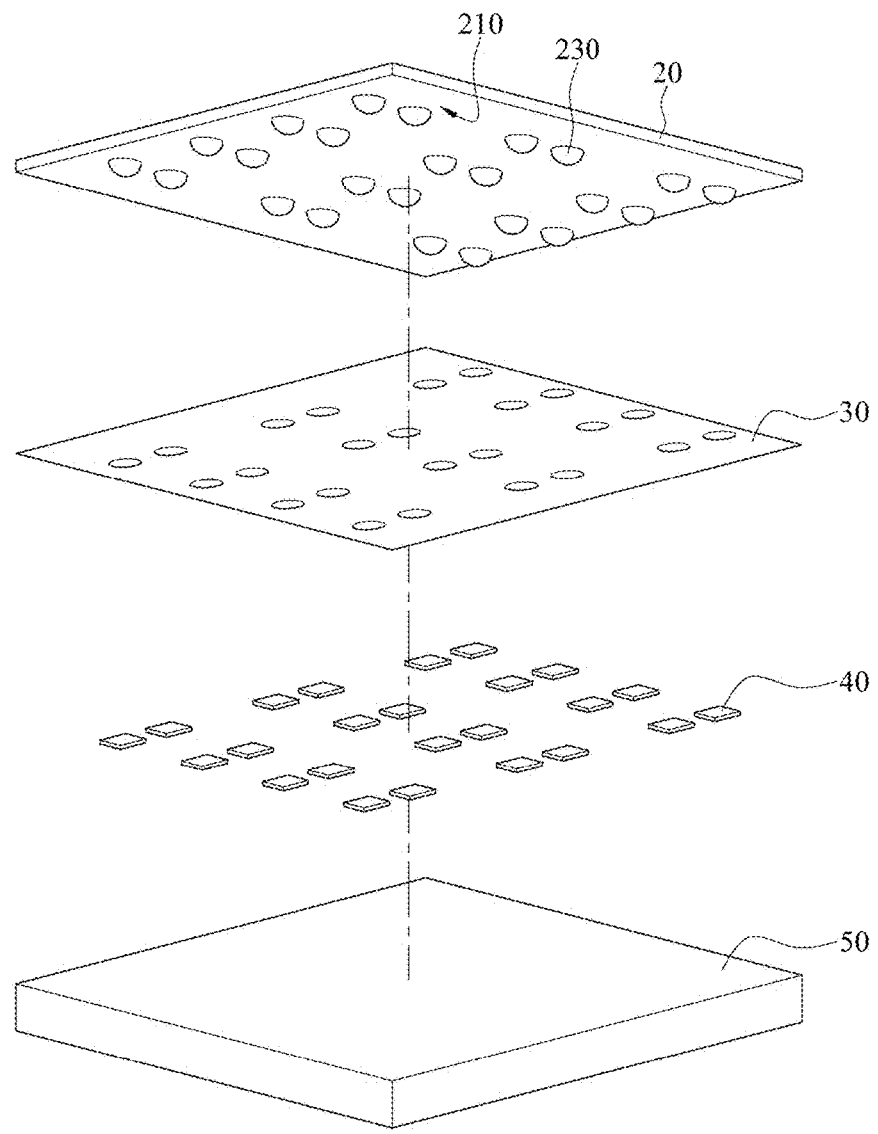
FIG. 8 is an exploded diagram of the electronic device in FIG. 7.

After pick-up (Step S160), the light-emitting elements 40 bonded by the first convex lens structures 230 are transferred to a driving-circuit substrate 50 by using the optical layer 20 (Step S180), as shown in FIG. 7 and FIG. 8. In some embodiments, the light-emitting elements 40 are flip flop light-emitting elements. A side of each light-emitting element 40 is a light emitting surface, and the other side is a joint pad. After Step S160, the light emitting surface of the light-emitting elements 40 is bonded to the corresponding first convex lens structure 230, and the pad of the light-emitting element 40 is located below (the other side opposite to the light emitting surface). Next, the optical layer 20 and the light-emitting elements 40 bonded thereon are moved to an area where transfer is to be performed (on the driving-circuit substrate 50), and the pads of the light-emitting elements 40 face a surface, having a connection electrode, of the driving-circuit substrate 50. Subsequently, through an alignment device (not shown), the pads of the light-emitting elements 40 are precisely aligned on the connection electrode of the driving-circuit substrate 50, to enable the pads of the light-emitting elements 40 to be electrically connected to the connection electrode of the driving-circuit substrate 50.

Figure 9:
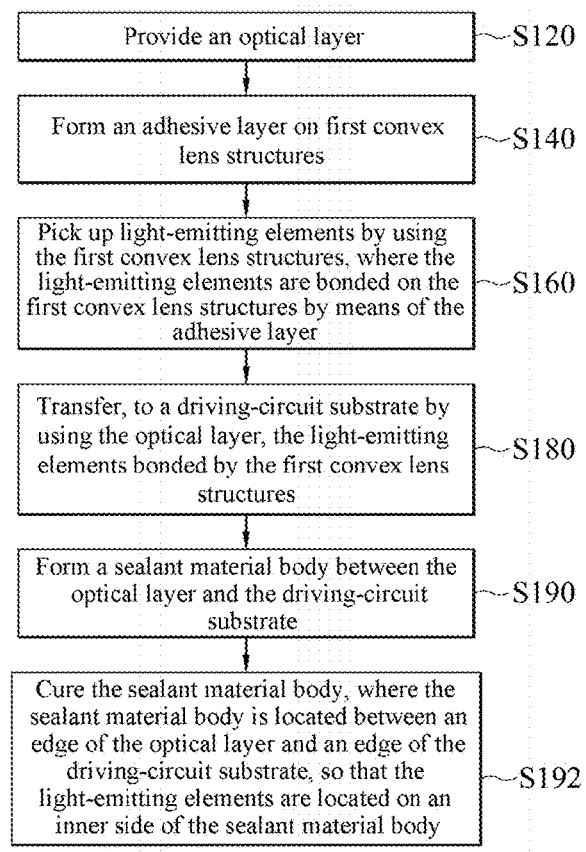
FIG. 9 is a flowchart of a method for fabricating an electronic device according to another embodiment of the present invention.
Figure 10:
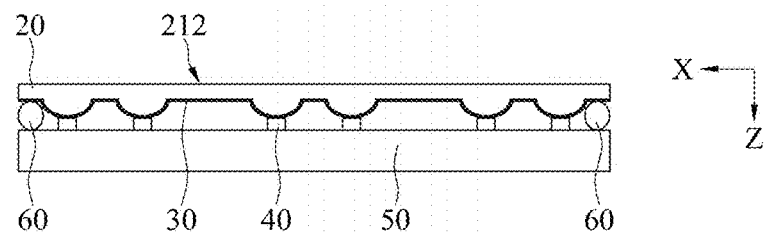
FIG. 10 is a schematic diagram of the electronic device before a sealant is cured according to the first embodiment of the present invention.
Figure 11:
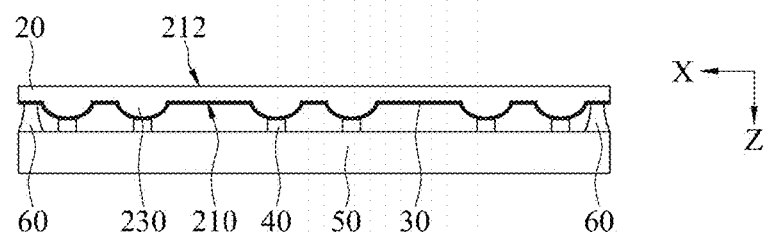
FIG. 11 is a schematic diagram of the electronic device after the sealant is cured according to the first embodiment of the present invention.

Refer to FIG. 9. FIG. 9 is a flowchart of a method for fabricating an electronic device according to another embodiment of the present invention. In some embodiments, after the light-emitting elements 40 are transferred on the driving-circuit substrate 50 (Step S180), a sealant 60 may be formed between the optical layer 20 and the driving-circuit substrate 50 (Step S190), as shown in FIG. 10. Subsequently, the sealant 60 between the optical layer 20 and the driving-circuit substrate 50 is cured (Step S192), as shown in FIG. 11. The sealant 60 is located on an edge of the optical layer 20 and located on an edge of the driving-circuit substrate 50, so that the light-emitting elements 40 are disposed on an inner side of the sealant 60. In particular, in this embodiment, a top surface of the sealant 60 is joined with the optical layer 20 along the edge of the optical layer 20, and a bottom surface of the sealant 60 is joined with the driving-circuit substrate 50 along the edge of the driving-circuit substrate 50, so that the light-emitting elements 40 are disposed inside a frame body formed of the sealant 60.

Figure 12:
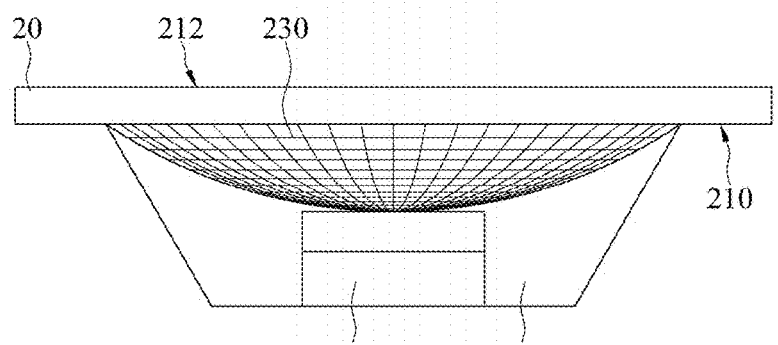
FIG. 12 is a schematic diagram of an optical simulation structure of the electronic device according to the first embodiment of the present invention.
Figure 13:
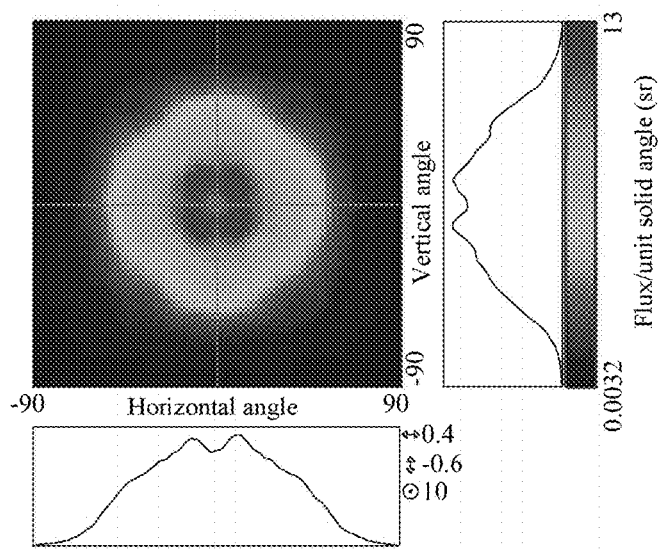
FIG. 13 to FIG. 16 are diagrams of field patterns of light emission of the optical simulation structure in FIG. 12.
Figure 14:
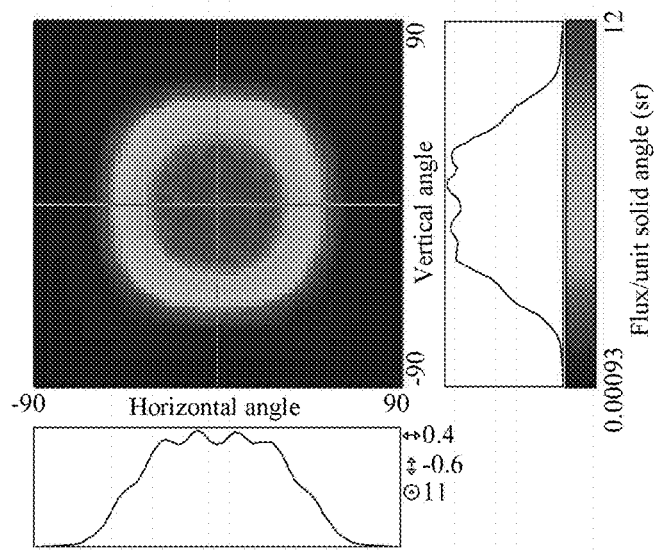
Figure 15:
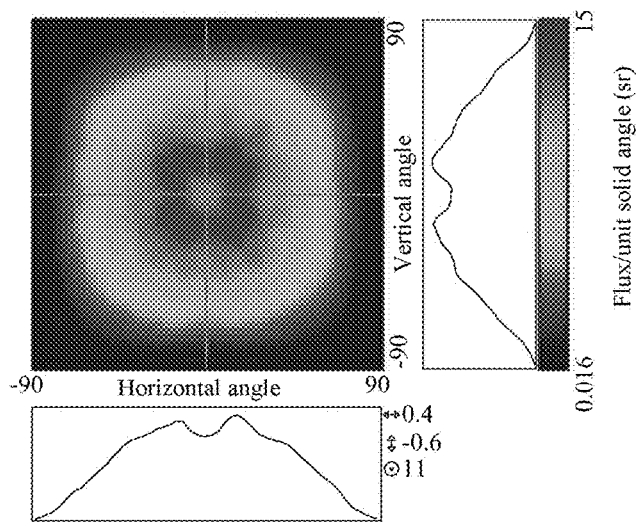
Figure 16:
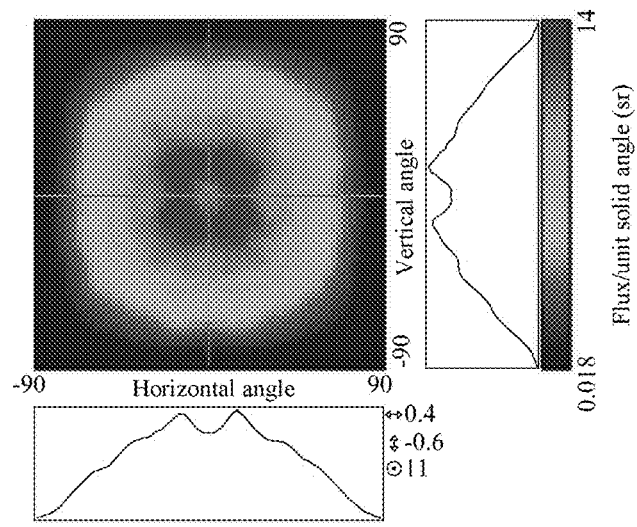

Refer to FIG. 12. FIG. 12 is a schematic diagram of an optical simulation structure of an electronic device according to a first embodiment of the present invention. In this embodiment, the optical layer 20 is a plano convex optical layer 20. That is, the first surface 210 of the optical layer 20 has first convex lens structures 230, and the second surface 212 is a flat surface (that is, a planar structure). The material of the optical layer 20 is PDMS. FIG. 13 to FIG. 16 are diagrams of field patterns of light emission of the optical simulation structure in FIG. 12. When a radius of curvature of the first convex lens structures 230 is 28 µm (micrometer) and no glue is filled in a surrounding area 90 of the light-emitting elements 40 (that is, the surrounding area 90 is filled with air), light emitting efficiency is approximately 22.7%, as shown in FIG. 13. When the radius of curvature of the first convex lens structures 230 is 100 µm and no glue is filled in the surrounding area 90 of the light-emitting elements 40 (that is, the surrounding area 90 is filled with air), light emitting efficiency is approximately 22.8%, as shown in FIG. 14. When the radius of curvature of the first convex lens structures 230 is 28 µm and glue HRI-1655 (produced by the company Dow Corning) (same as an adhesive material used for the adhesive layer 30) is filled in the surrounding area 90 of the light-emitting elements 40, light emitting efficiency is approximately 40.7%, as shown in FIG. 15. When the radius of curvature of the first convex lens structures 230 is 100 µm and glue HRI-1655 (same as the adhesive material used for the adhesive layer 30) is filled in the surrounding area 90 of the light-emitting elements 40, light emitting efficiency is approximately 39.8%, as shown in FIG. 16.

Figure 17:
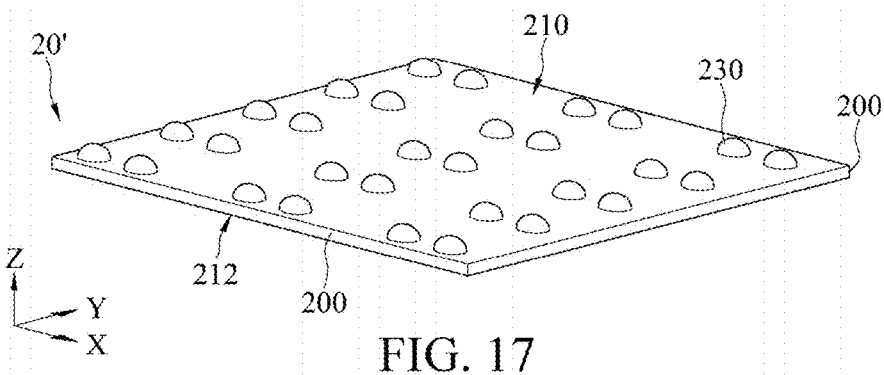
FIG. 17 and FIG. 18 are brief perspective diagrams of an optical layer from different viewing angles according to a second embodiment of the present invention, where
Figure 18:
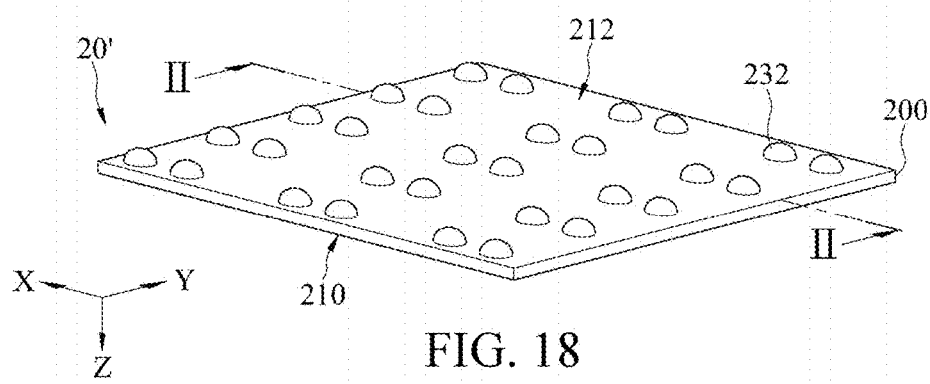
Figure 19:
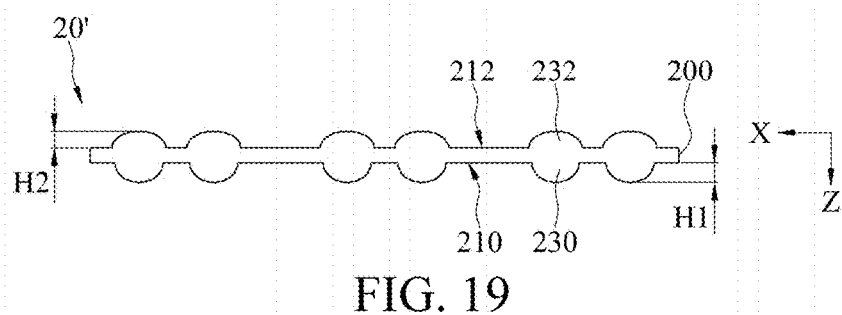
FIG. 19 is a sectional view along a sectional line II-II in FIG. 18.
Figure 20:
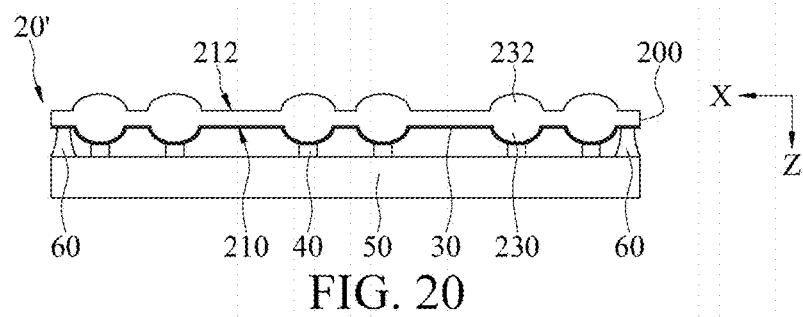
FIG. 20 is a schematic diagram of an electronic device according to the second embodiment of the present invention.

Refer to FIG. 17 to FIG. 20. An electronic device according to a second embodiment of the present invention is different from the electronic device according to the first embodiment in that an optical layer of the electronic device according to the second embodiment of the present invention further includes a plurality of second convex lens structures 232. In this embodiment, an optical layer 20' is a biconvex optical layer 20'. As shown in FIG. 17, FIG. 19, and FIG. 20, a plurality of first convex lens structures 230 used for bonding and transferring light-emitting elements 40 is formed on a first surface 210 of the optical layer 20'. As shown in FIG. 18, FIG. 19, and FIG. 20, a plurality of second convex lens structure 232 is formed on a second surface 212 of the optical layer 20'.

In this embodiment, each second convex lens structure 232 is a plano convex lens located on the second surface 212. In other words, a surface of each second convex lens structure 232 is a convex curved surface, and the other surface of each second convex lens structure 232 is a plane which is overlapped and bonded with the second surface 212. In some embodiments, each second convex lens structure 232 and a body 200 of the optical layer 20' are integrally formed, that is, a plane where the second convex lens structures 232 and the body 200 (the second surface 212) bond in fact does not exist. In other words, the second convex lens structures 232 are implemented by a plurality of convex curved surfaces protruding outwardly from the second surface 212 (the negative Z-axis direction). Details of the first convex lens structures 230 in this embodiment are similar to those of the optical layer 20 in the first embodiment, and therefore are no longer elaborated.

In this embodiment, in the vertical projection direction (Z-axis), the first convex lens structures 230 and the second convex lens structures 232 are overlapped with each other. In other words, the first convex lens structures 230 correspond to the second convex lens structures 232 one by one, but the present invention is not limited thereto.

In some embodiments, an average height of the second convex lens structures 232 is less than or equal to an average height of the first convex lens structures 230. The average height of the first convex lens structures 230 refers to an average of the shortest vertical distances (height H1) of the first convex lens structures 230 from the first surface 210 to peaks of the first convex lens structures 230. The average height of the second convex lens structures 232 refers to an average of the shortest vertical distances (height H2) of the second convex lens structures 232 from the second surface 212 to peaks of the second convex lens structures 232.

In addition, in some embodiments, a radius of curvature of at least one of the first convex lens structures is less than or equal to a radius of curvature of at least one of the second convex lens structures. In other embodiments, a radius of curvature of each first convex lens structure 230 is less than or equal to a radius of curvature of each second convex lens structure 232. In other words, a convex curved surface of the first convex lens structure 230 is smoother than a convex curved surface of the second convex lens structure 232.

Figure 21:
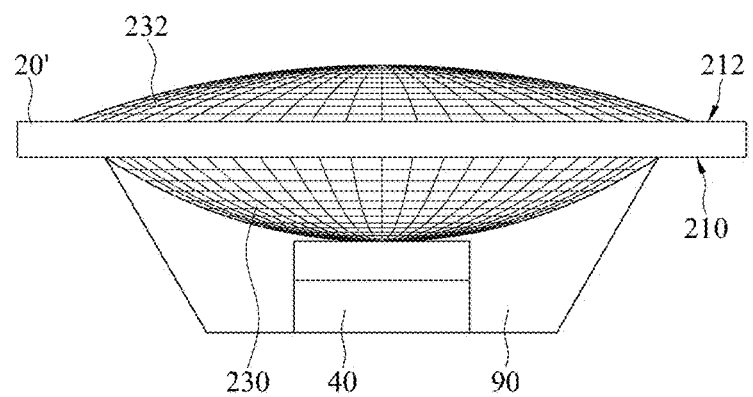
FIG. 21 is a schematic diagram of an optical simulation structure of the electronic device according to the second embodiment of the present invention.
Figure 22:
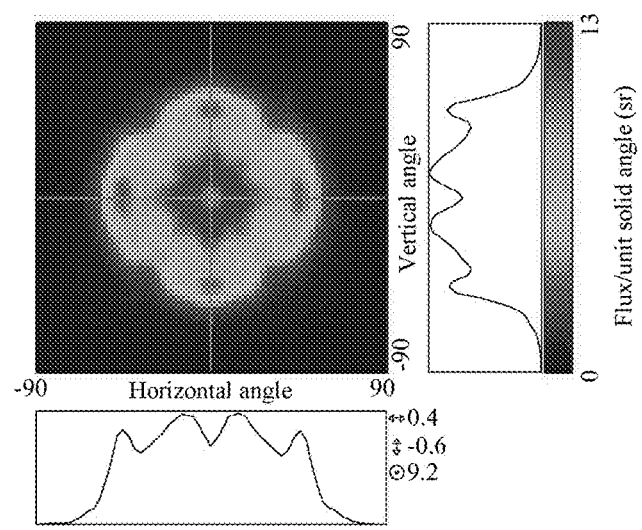
FIG. 22 to FIG. 25 are diagrams of field patterns of light emission of the optical simulation structure in FIG. 21.
Figure 23:
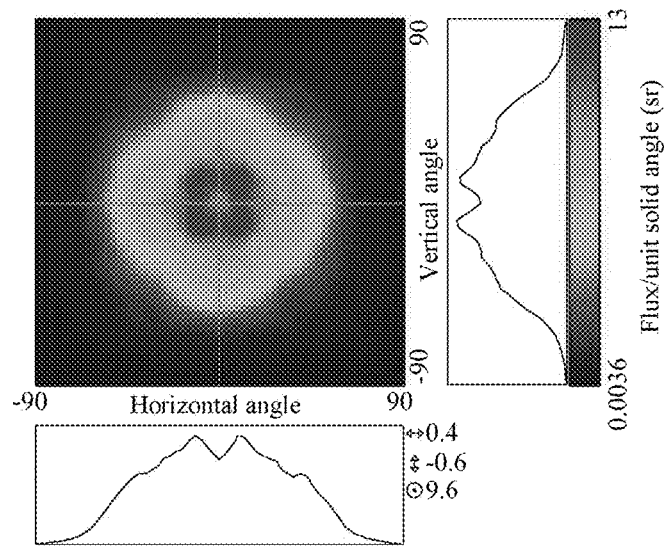
Figure 24:
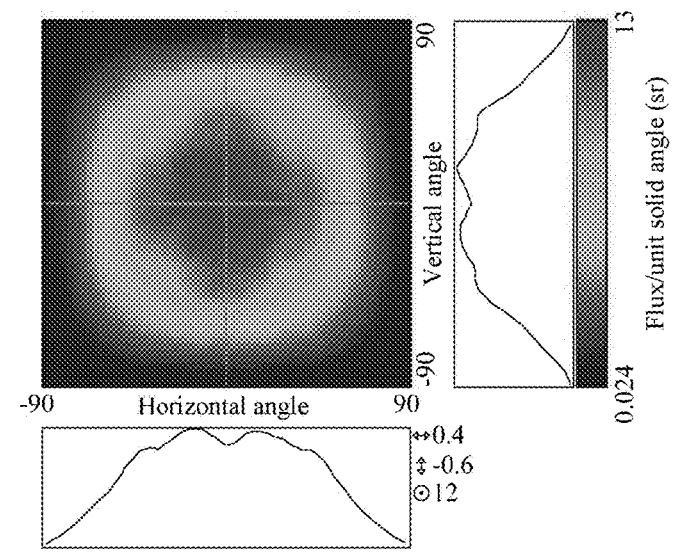
Figure 25:
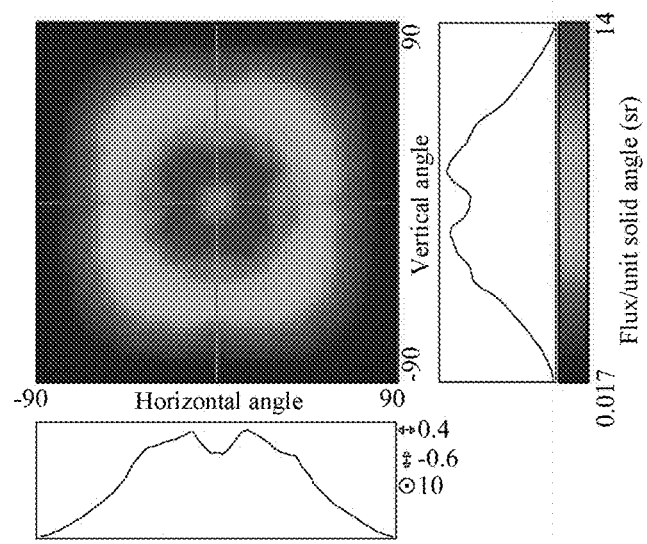

Refer to FIG. 21. FIG. 21 is a schematic diagram of an optical simulation structure of the electronic device according to the second embodiment of the present invention. In this embodiment, the optical layer 20' is a biconvex optical layer 20'. That is, a first surface 210 of the optical layer 20' has first convex lens structures 230, and a second surface has second convex lens structures 232. In the following experiment, a material of the optical layer 20' is PDMS and the radius of curvature of the first convex lens structures 230 is fixedly 28 µm. FIG. 22 to FIG. 25 are diagrams of field patterns of light emission of the optical simulation structure in FIG. 21. When a radius of curvature of the second convex lens structure 232 28 µm and no glue is filled in the surrounding area 90 of the light-emitting elements 40 (that is, the surrounding area 90 is filled with air), light emitting efficiency is approximately 22.4%, as shown in FIG. 22. When the radius of curvature of the second convex lens structure 232 is 100 µm and no glue is filled in the surrounding area 90 of the light-emitting elements 40 (that is, the surrounding area 90 is filled with air), light emitting efficiency is approximately 22.7%, as shown in FIG. 23. When the radius of curvature of the second convex lens structure 232 is 28 µm and glue HRI-1655 (same as the adhesive material used for the adhesive layer 30) is filled in the surrounding area 90 of the light-emitting elements 40, light emitting efficiency is approximately 39.3%, as shown in FIG. 24. When the radius of curvature of the second convex lens structure 232 is 100 μm and glue HRI-1655 (same as the adhesive material used for the adhesive layer 30) is filled in the surrounding area 90 of the light-emitting elements 40, light emitting efficiency is approximately 36.3%, as shown in FIG. 25.

As can be seen from results in FIG. 13 to FIG. 16 and in FIG. 22 to FIG. 25 in the foregoing, when glue is filled in the surrounding area 90 of the light-emitting elements 40, light emission of the light-emitting elements 40 may become evenly distributed and light emitting efficiency may be improved. Moreover, in different curvatures, fine adjustment may be performed on an optical field pattern. Furthermore, the form of the optical layer (a plano convex optical layer 20 and a biconvex optical layer 20') may be used to adjust the shape of distribution of light emission.

Figure 26:
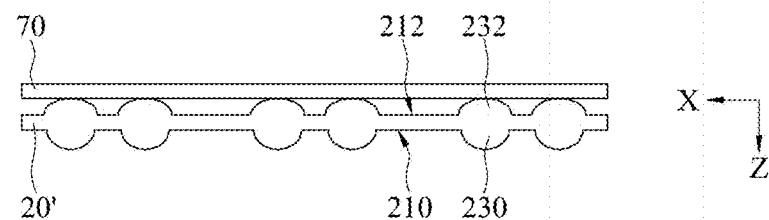
FIG. 26 is a schematic diagram of a combined structure of the optical layer and a carrier according to the second embodiment of the present invention.

In some embodiments, when a plurality of second convex lens structures 232 is formed on a second surface 212 of the optical layer 20', and before the light-emitting elements 40 are picked up (Step S160), a carrier 70 may be bonded with the second convex lens structures 232, as shown in FIG. 26. Adhesiveness between the carrier 70 and the second convex lens structures 232 is less than adhesiveness of the adhesive layer 30. In other words, adhesiveness exists between the carrier 70 and the second convex lens structures 232, so that the carrier 70 is bonded on the second convex lens structures 232. Therefore, in subsequent procedures, the second convex lens structures 232 can be protected by using the carrier 70, and movement of the optical layer 20' becomes convenient. Moreover, after the light-emitting elements 40 are transferred (Step S180), the carrier 70 is then removed from the optical layer 20'.

In some embodiments of Step S120, the optical layer 20 (or the optical layer 20') may be formed by using a female die.

Figure 27:
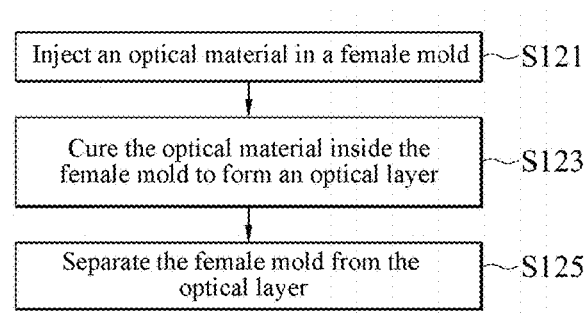
FIG. 27 is a detailed flowchart of Step S120 of the fabrication method in the present invention.

Refer to FIG. 27. First, an optical material is injected into a female die (Step S121). For the female die, reference may be made to FIG. 28 and FIG. 29.

Figure 28:
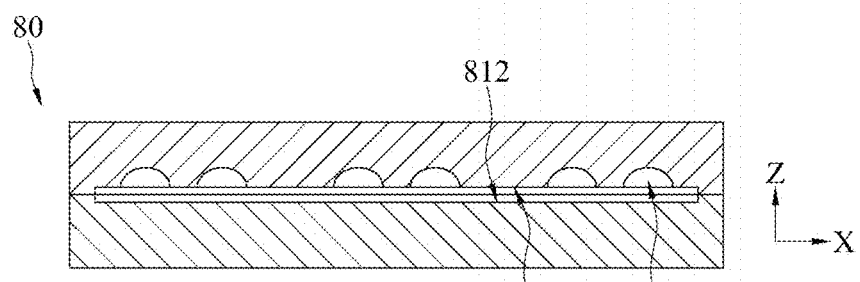
FIG. 28 is a schematic diagram of a female die according to the first embodiment of the present invention.

FIG. 28 is a schematic diagram of the female die according to the first embodiment of the present invention. Referring to FIG. 28, a first surface 810 inside the female die 80 has a plurality of first curved grooves 830. The first curved grooves 830 are implemented by a plurality of convex curved surfaces being concave downwardly from the first surface 810 (the positive Z-axis direction). Refer to both FIG. 4 and FIG. 28. The first curved grooves 830 of the female die 80 correspond to the first convex lens structures 230 that are to be formed on the optical layer 20. In other words, a contour of the first curved groove 830 is approximately the same as a contour of the first convex lens structure 230 that corresponds to the first curved groove 830 and is to be formed. In some embodiments, a radius of curvature of the first curved groove 830 is the same as a radius of curvature of the first convex lens structure 230 that corresponds to the first curved groove 830 and is to be formed. In addition, a second surface 812 inside the female die 80 is a flat surface, and the first surface 810 faces the second surface 812.

Figure 29:
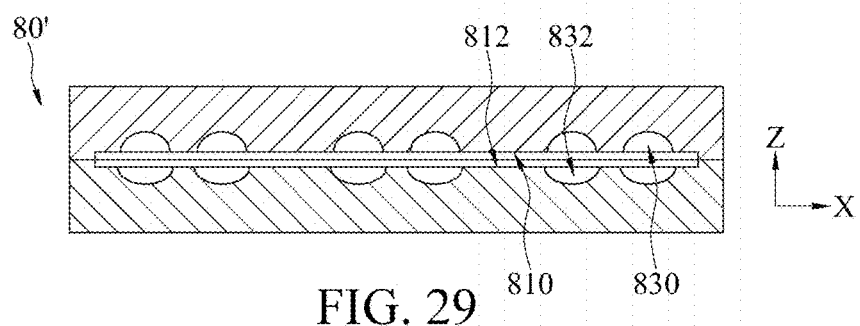
FIG. 29 is a schematic diagram of a female die according to the second embodiment of the present invention.
Figure 30:
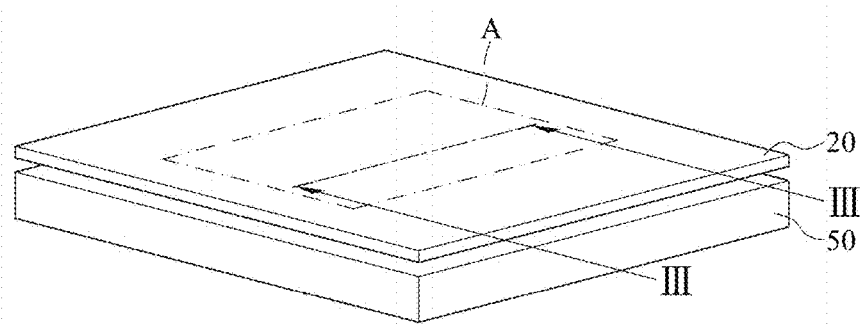
FIG. 30 is a brief perspective diagram of the electronic device in FIG. 7.
Figure 31:
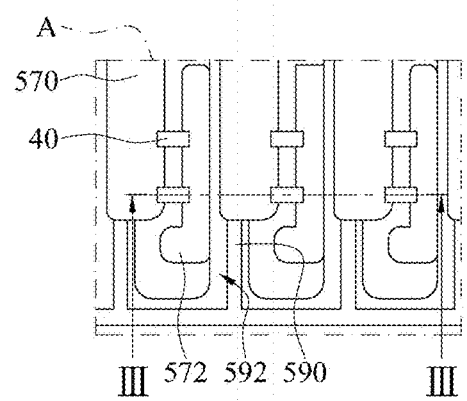
FIG. 31 is a top view of a driving-circuit substrate in an area A in FIG. 30.
Figure 32:
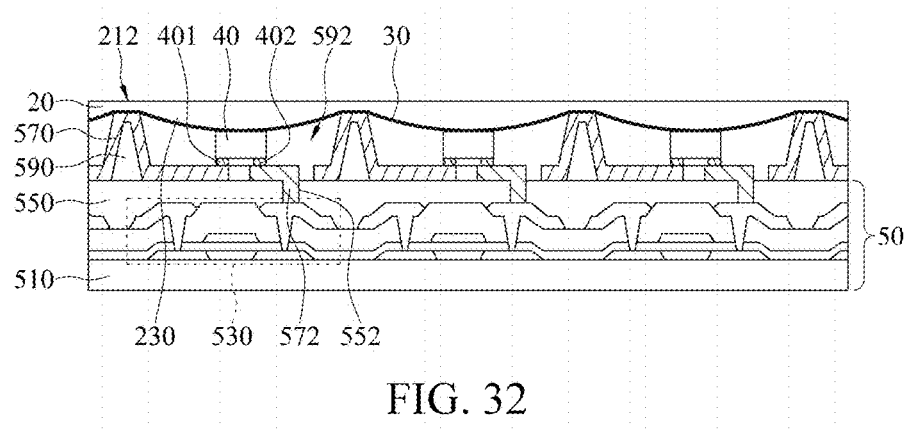
FIG. 32 is a sectional view along a sectional line III-III in FIG. 30 and FIG. 31.
Figure 33:
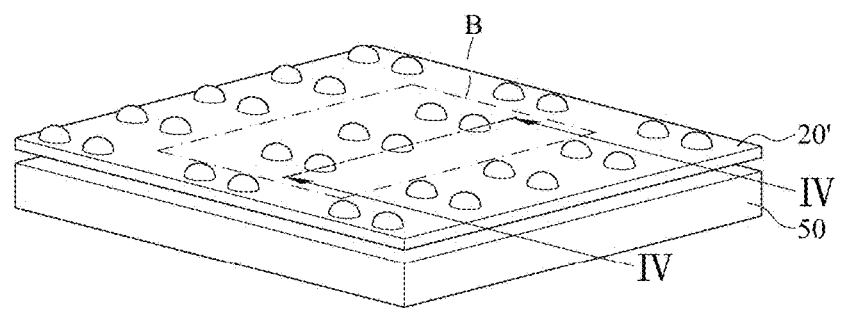
FIG. 33 is a brief perspective diagram of the electronic device in FIG. 20.
Figure 34:
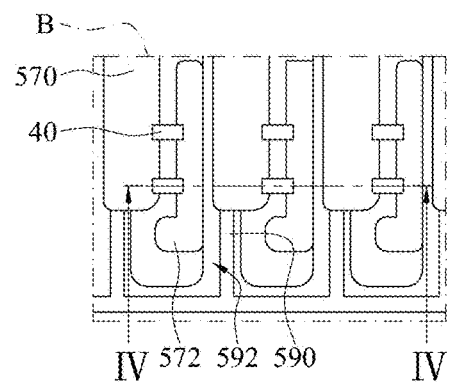
FIG. 34 is a top view of a driving-circuit substrate in an area B in FIG. 33.
Figure 35:
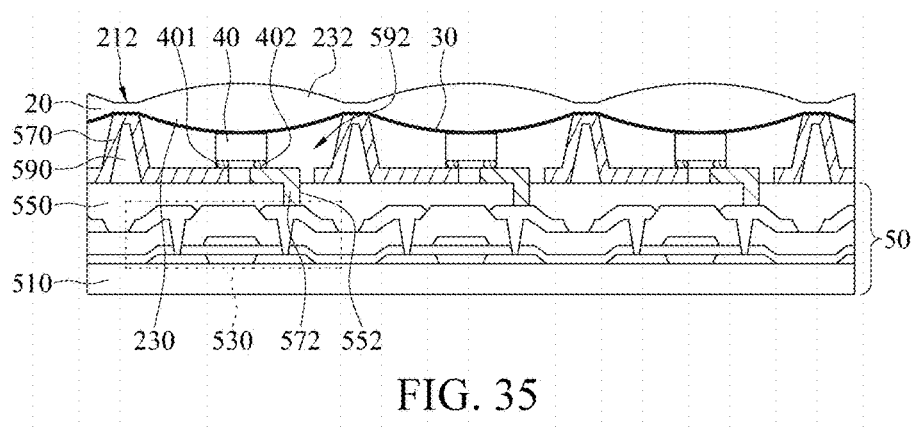
FIG. 35 is a sectional view along a sectional line IV-IV in FIG. 33 and FIG. 34.

FIG. 29 is a schematic diagram of the female die according to the second embodiment of the present invention. Referring to FIG. 29, the first surface 810 inside the female die 80' has a plurality of first curved grooves 830. The first curved grooves 830 are implemented by a plurality of convex curved surfaces being concave downward from the first surface 810 (the positive Z-axis direction). Refer to both FIG. 19 and FIG. 29. First curved grooves 830 of the female die 80' correspond to the first convex lens structures 230 that are to be formed on the optical layer 20'. In other words, a contour of the first curved groove 830 is approximately the same as a contour of the first convex lens structure 230 that corresponds to the first curved groove 830 and is to be formed. In some embodiments, a radius of curvature of the first curved groove 830 is the same as a radius of curvature of a corresponding first convex lens structure 230 that is to be formed. In addition, the second surface 812 inside the female die 80' has a plurality of second curved grooves 832, and the second curved grooves 832 are implemented by a plurality of convex curved surfaces being concave downward from the second surface 812 (the negative Z-axis direction). The first surface 810 faces the second surface 812. The second curved grooves 832 of the female die 80' correspond to the second convex lens structures 232 that are to be formed on the second surface 212 of the optical layer 20'. In other words, a contour of the second curved groove 832 is approximately the same as a contour of a second convex lens structure 232 that corresponds to the second curved groove 832 and is to be formed of the optical layer 20'. In some embodiments, a radius of curvature of the second curved groove 832 is the same as a radius of curvature of a corresponding second convex lens structure 232 to be formed of the optical layer 20'.

In an embodiment, the optical material is, for example, PDMS, MS or another suitable optical material.

After the optical material is injected (Step 121), the optical material inside the female die is cured to form an optical layer (Step 123). After curing (Step 123), the female die is separated from the optical layer, that is, the optical layer having a required form is obtained (Step 125).

Referring to FIG. 28, in this embodiment, after the optical material inside the female die 80 is cured, the optical material inside the first curved grooves 830 is formed into the first convex lens structures 230 of the optical layer 20, and the optical material that contacts the second surface 812 of the female die 80 is formed into the flat second surface 212 of the optical layer 20. Next, the female die 80 is separated from the optical layer 20, and the optical layer 20 of which the first surface 210 has the first convex lens structures 230 and the second surface 212 is flat is obtained.

Refer to FIG. 29. In this embodiment, after the optical material inside the female die 80' is cured, the optical material inside the first curved grooves 830 is formed into the first convex lens structures 230 of the optical layer 20', and the optical material inside that second curved grooves 832 is formed into the second convex lens structures 232 of the optical layer 20'. Next, the female die 80' is separated from the optical layer 20', and the optical layer 20' of which the first surface 210 has the first convex lens structures 230 and the second surface 212 has the second convex lens structures 232 is obtained.

In some embodiments, the foregoing light-emitting elements 40 may be LEDs. Preferably, the foregoing light-emitting elements 40 may be micro-LEDs. In some embodiments, for the electronic device and the method for fabricating the same in any embodiment in the foregoing, micro elements such as a chip may be simultaneously transferred in the same manner.

For example, application of an LED display panel is used as an example. The driving-circuit substrate 50 may be an active array substrate or a passive array substrate. By means of the method for fabricating an electronic device in any embodiment, a micro LED (the light-emitting elements 40)

can be transferred to the active or passive array substrate (the driving-circuit substrate 50), as shown in FIG. 30 to FIG. 32 or FIG. 33 to FIG. 35.

Referring to FIG. 30 to FIG. 32 or FIG. 33 to FIG. 35, each light-emitting element 40 has two pads (referred to as a first electrode 401 and a second electrode 402 below). For example, the first electrode 401 may be an N electrode, and the second electrode 402 may be a P electrode, but the present invention is not limited thereto.

The driving-circuit substrate 50 includes a substrate 510, a plurality of driving elements 530, an insulation layer 550, a plurality of first connection electrodes 570, and a plurality of second connection electrodes 572. The driving elements 530 are disposed on the substrate 510, and the insulation layer 550 is disposed on the driving elements 530. The first connection electrodes 570 and the second connection electrodes 572 are disposed on the insulation layer 550, and the second connection electrodes 572 are electrically connected to the driving elements 530. Each light-emitting element 40 corresponds to one of the driving elements 530.

The first electrode 401 of the light-emitting element 40 is electrically connected to the first connection electrode 570. In this embodiment, the first connection electrode 570 is connected to a fixed potential. In other words, the first electrode 401 of the light-emitting element 40 may be electrically connected to a fixed potential via the first connection electrode 570. The fixed potential may be, for example, a grounded potential, but the present invention is not limited thereto.

The second electrode 402 of the light-emitting element 40 is electrically connected to the second connection electrode 572. In this embodiment, the second connection electrode 572 is electrically connected to an electrode (for example, a source/drain) of the driving element 530. Here, a first end of the second connection electrode 572 is electrically connected to a corresponding driving element 530, and a second end of the second connection electrode 572 is located on the insulation layer 550, and is electrically connected to a second electrode 402 of a corresponding light-emitting element 40. In other words, each second connection electrode 572 is filled into a through hole 552 of the insulation layer 550, so that the second electrode 402 of the light-emitting element 40 is electrically connected to the corresponding driving element 530 through the corresponding second connection electrode 572. Therefore, the light-emitting elements 40 may provide, through the driving element 530, a driving voltage required for light emission.

In some embodiments, the driving-circuit substrate 50 may further include a patterned bank layer 590, and this patterned bank layer 590 is disposed on the insulation layer 550. The patterned bank layer 590 has a plurality of openings 592. Moreover, after transfer, the light-emitting elements 40 are located inside the openings 592, and improve a light emission effect of the light-emitting elements 40 through the patterned bank layer 590.

In other words, in an embodiment of Step S180, the light-emitting elements 40 bonded by the first convex lens structures 230 are transferred into the openings 592 on the driving-circuit substrate 50 by using the optical layer 20 (or the optical layer 20'), so that the first electrode 401 of the light-emitting elements 40 is electrically connected to the corresponding first connection electrode 570, and the second electrode 402 of the light-emitting element 40 is electrically connected to the corresponding second connection electrode 572.

In some embodiments, when the light-emitting elements 40 are transferred on the corresponding first connection electrodes 570 and second connection electrodes 572, each first connection electrode 570 may be welded with the first electrode 401 of a corresponding light-emitting element 40 and each second connection electrode 572 may be welded with the second electrode 402 of a corresponding light-emitting element 40, thereby ensuring electrical conduction between the first electrode 401 of the light-emitting element 40 and the corresponding first connection electrode 570, and electrical conduction between the second electrode 402 of the light-emitting element 40 and the corresponding second connection electrode 572.

In some embodiments, after the light-emitting elements 40 are transferred, glue may be filled in the surrounding area of the light-emitting elements 40, that is, glue is injected inside the openings 592. For example, the glue may be injected through a gap between the edge of the optical layer 20 and the edge of the driving-circuit substrate 50, so that the surrounding area of the light-emitting elements 40 is filled with glue, but the present invention is not limited thereto. In other words, glue exists in space among the optical layer 20 (or the optical layer 20'), the light-emitting elements 40, and the driving-circuit substrate 50. Here, the injected (filled) glue is transparent glue. In some embodiments, for example, the glue may be an optical adhesive such as an ultraviolet adhesive, glass glue or AB glue.

In some embodiments, after glue is filled, the glue may be cured, thereby joining the optical layer 20 and the driving-circuit substrate 50 and strengthening a connection between the light-emitting elements 40 and the driving-circuit substrate 50. In other embodiments, after glue is filled, a sealant 60 may be further formed and cured between the edge of the optical layer 20 and the edge of the driving-circuit substrate 50, so that the light-emitting elements 40 and the filled glue are located on an inner side of the sealant 60.

In conclusion, the electronic device and the method for fabricating the same according to the present invention are applicable to transfer of the light-emitting elements 40. The light-emitting elements 40 are bonded on the optical layer 20 (or the optical layer 20') through the adhesive layer 30, and the optical layer 20 (or the optical layer 20') does not need to be removed after the light-emitting elements 40 are transferred. Therefore, events such as falling off of the light-emitting elements 40 from the optical layer 20 (or 20') and misalignment of the light-emitting elements 40 can be avoided, so that a yield of the electronic device can be improved. Moreover, after transfer, the optical layer 20 (or the optical layer 20') is still kept on the light-emitting elements 40 (and does not need to be removed), and is used as a light condensing device of the light-emitting elements 40, thereby improving light emitting efficiency.

What is claimed is:
1. An electronic device, comprising:
   a driving-circuit substrate;
   a plurality of light-emitting elements, located on the driving-circuit substrate, wherein each of the light-emitting elements has a first electrode and a second electrode;
   an optical layer, located on the light-emitting elements, wherein the optical layer comprises a first surface and a second surface opposite to each other, the first surface has a plurality of first convex lens structures, and at least a part of the first convex lens structures are overlapped with the light-emitting elements in a vertical projection direction; and
   an adhesive layer, located between the optical layer and the light-emitting elements,
   wherein the driving-circuit substrate comprises:

a substrate;

a plurality of driving elements, disposed on the substrate;

an insulation layer, disposed on the driving elements;

a plurality of first connection electrodes, disposed on the insulation layer, wherein each of the first connection electrodes has a first end and a second end, the first end is electrically connected to a corresponding driving element, and the second end is electrically connected to the first electrode of a corresponding light-emitting element;

a plurality of second connection electrodes, respectively electrically connected to the second electrode of the corresponding light-emitting element; and a patterned bank layer, disposed on the insulation layer, and having a plurality of openings, wherein the light-emitting elements are located inside the openings.

2. The electronic device according to claim 1, wherein the second surface is a planar structure.

3. The electronic device according to claim 1, wherein the second surface has a plurality of second convex lens structures.

4. The electronic device according to claim 3, wherein the second convex lens structures and the first convex lens structures are overlapped with each other in the vertical projection direction.

5. The electronic device according to claim 3, wherein an average height of the second convex lens structures is less than or equal to an average height of the first convex lens structures.

6. The electronic device according to claim 3, wherein a curvature radius of one of the first convex lens structures is less than or equal to a curvature radius of one of the second convex lens structures.

7. The electronic device according to claim 1, wherein a refractive index of the optical layer is between 1.4 and 1.6.

8. The electronic device according to claim 1, wherein an elasticity coefficient of the optical layer is between 1 MPa and 12 MPa.

9. The electronic device according to claim 1, wherein the first convex lens structures are located inside corresponding openings in the vertical projection direction.

10. The electronic device according to claim 1, further comprising:

a sealant, located between the optical layer and the driving-circuit substrate, wherein the sealant is located on an edge of the optical layer and an edge of the driving-circuit substrate, and the light-emitting elements are located on an inner side of the sealant.

* * * * *